US012672516B2

(12) United States Patent
Chen et al.

(10) Patent No.:  US 12,672,516 B2
(45) Date of Patent:     Jun. 30, 2026

(54) METHOD OF MANUFACTURING LAMINATED DEVICE CHIPS INCLUDING A DIVIDING STEP AFTER A CUTTING STEP

(71) Applicant: DISCO CORPORATION, Tokyo (JP)

(72) Inventors: Zhiwen Chen, Tokyo (JP); Nobuyasu Kitahara, Tokyo (JP)

(73) Assignee: DISCO CORPORATION, Tokyo (JP)

( * ) Notice:  Subject to any disclaimer, the term of this patent is extended or adjusted under 35 U.S.C. 154(b) by 324 days.

(21) Appl. No.: 18/457,577

(22) Filed:    Aug. 29, 2023

(65)                Prior Publication Data

US 2024/0079261 A1     Mar. 7, 2024

(30)        Foreign Application Priority Data

Sep. 5, 2022    (JP) ................................. 2022-140484

(51) Int. Cl.
*H10P 72/70*      (2026.01)
*H10P 52/00*      (2026.01)
*H10W 74/01*      (2026.01)
*H10W 74/10*      (2026.01)

(52) U.S. Cl.
CPC .......... *H10P 72/7402* (2026.01); *H10P 52/00* (2026.01); *H10W 74/01* (2026.01); *H10W 74/111* (2026.01); *H10P 72/7416* (2026.01)

(58) Field of Classification Search
CPC ....... H01L 21/3043; H01L 2221/68327; H01L 21/78; H01L 21/6836; H01L 21/6835; H01L 2221/68381; H01L 2224/95001; H01L 21/56; H01L 23/3107; H01L 21/561; H01L 24/96; H01L 21/565; H01L 25/0657; H01L 21/187; H10D 89/011; H10P 72/7402; H10P 52/00; H10P 72/7416; H10P 72/744; H10P 54/00;

H10P 72/74; H10P 10/128; H10P 58/00; H10W 74/01; H10W 74/111; H10W 74/014; H10W 90/00; H10W 46/00; H10W 72/013; H10W 72/071; H10W 72/30; H10W 72/0198; H10W 74/016; B23K 26/36
See application file for complete search history.

(56)            References Cited

U.S. PATENT DOCUMENTS

2017/0162420 A1*   6/2017  Morikazu ........... H01L 21/6835
2023/0020620 A1*   1/2023  Chen ................ H01L 21/02021

FOREIGN PATENT DOCUMENTS

JP      2012134231 A     7/2012
JP      2015191961 A    11/2015
JP      2015233049 A    12/2015

OTHER PUBLICATIONS

Office Action issued by the Japanese Patent Office in corresponding JP Patent Application No. 2022-140484, dated Mar. 24, 2026.

* cited by examiner

*Primary Examiner* — John P. Dulka
(74) *Attorney, Agent, or Firm* — Greer Burns & Crain Ltd.

(57)            ABSTRACT

A method of manufacturing laminated device chips includes affixing a support substrate to a face side of a first device wafer, processing the first device wafer from a reverse side thereof to thin down the first device wafer to a predetermined thickness, forming cut grooves in the first device wafer thereby to cut the first device wafer, affixing the first device wafer to a second device wafer, peeling off the support substrate from the first device wafer, and dividing the second device wafer into a plurality of laminated device chips.

7 Claims, 11 Drawing Sheets

METHOD OF MANUFACTURING LAMINATED DEVICE CHIPS INCLUDING A DIVIDING STEP AFTER A CUTTING STEP

BACKGROUND OF THE INVENTION

Field of the Invention

The present invention relates to a method of manufacturing laminated device chips from a first device wafer and a second device wafer that are affixed to each other.

Description of the Related Art

In recent years, device chips for use in electronic appliances are laminated and housed in packages to achieve reduced footprints required by the device chips installed on certain components and also to achieve reduced electric power consumption of system-on-a-chip (SoC) devices. Heretofore, it has been customary to laminate a plurality of device chips produced by dividing a semiconductor wafer and connect the device chips by way of wire bonding. However, a package that houses the device chips has to be large in size because it requires regions that accommodate wires used to connect the device chips.

In view of the above problem, there has been developed a technology in which a substrate that is prepared in addition to upper and lower device chips has electrodes extending thicknesswise therethrough, and the substrate is interposed between the device chips to connect the device chips with the electrodes. The substrate interposed between the device chips is referred to as "interposer" and the technology that connects the upper and lower device chips with the electrodes extending through the substrate is referred to as "through-silicon via" (TSV). For example, a silicon substrate is used as the interposer substrate. Since TSV has shorter interconnect lengths than wires, it has very low interconnect resistance and inductance and can greatly reduce electric power consumption. Laminated device chips may be fabricated according to another process. For example, a plurality of device chips are arrayed on a support substrate and then encapsulated by a resin, producing a temporary wafer. Thereafter, the temporary wafer is thinned down by grinding the encapsulating resin layer. The temporary wafer is affixed to a device wafer, producing a bonded wafer. Then, the support substrate is removed from the bonded wafer, after which electrodes are formed through the device chips for interconnecting the devices of the device chips and the devices of the device wafer (see JP 2012-134231A).

According to still another process, a plurality of device chips are arrayed on a device wafer and encapsulated by a resin, after which the device wafer is planarized. Thereafter, the devices of the device wafer and the devices of the device chips are interconnected by electrodes (see JP 2015-233049A). Efforts are being made to develop a process of laminating wafers, forming electrodes through the laminated wafers, and interconnecting the wafers with the electrodes. This technology is referred to as "wafer on wafer" (WoW). According to another process that is being developed, a wafer is divided into individual device chips, and the device chips are mounted on another wafer by metal bumps. This technology is referred to as "chip on wafer" (CoW). The laminated wafers or the wafer with the device chips mounted thereon are divided into individual laminated device chips.

SUMMARY OF THE INVENTION

Recent years have seen demands for smaller and thinner semiconductor device packages with the advent of smaller and thinner electronic appliances incorporating device chips. There is known in the art a three-dimensional packaging technology for vertically laminating a plurality of thinned device chips as a process of integrating a plurality of devices into one package. However, the thinner the device chips become, the more difficult it is to handle the device chips. In order to meet demands for stable delivering and bonding processes for device chips, the device chips cannot be thinned down to an extremely thin shape having a thickness of 10 μm or less.

It is therefore an object of the present invention to provide a method of manufacturing laminated device chips including extremely thin device chips easily and stably.

In accordance with an aspect of the present invention, there is provided a method of manufacturing laminated device chips including a preparing step of preparing a first device wafer having a plurality of areas demarcated in a face side thereof by a grid of first projected dicing lines established therein and containing respective first devices, a second device wafer having a plurality of areas demarcated in a face side thereof by a grid of second projected dicing lines established therein and containing respective second devices, and a support substrate, an integrating step of affixing the support substrate to the face side of the first device wafer to integrally combine the support substrate and the first device wafer with each other, after the integrating step, a thinning step of processing the first device wafer from a reverse side thereof to thin down the first device wafer to a predetermined thickness, a cutting step of forming cut grooves in the first device wafer along the first projected dicing lines thereby to cut the first device wafer, an affixing step of affixing the first device wafer as cut to the second device wafer, a peeling step of peeling the support substrate from the first device wafer as cut, and a dividing step of dividing the second device wafer along the second projected dicing lines into a plurality of individual laminated device chips.

Preferably, the integrating step includes affixing the support substrate to the first device wafer with an adhesive, and the peeling step includes reducing the bonding strength of the adhesive and peeling off the support substrate from the first device wafer.

Alternatively, preferably, the integrating step includes affixing the support substrate to the first device wafer with an adhesive, the cutting step includes fully cutting the support substrate together with the first device wafer into a plurality of device chips, the affixing step includes placing the device chips on the second device wafer from the first device wafer side and thereafter affixing a tape to the support substrate, and the peeling step includes applying a laser beam through the tape and the support substrate to the adhesive to reduce the bonding strength of the adhesive and peeling off the support substrate together with the tape from the first device wafer.

Alternatively, preferably, the integrating step includes affixing the support substrate to the first device wafer with a thermoplastic adhesive, the cutting step includes fully cutting the support substrate together with the first device wafer into a plurality of device chips, the affixing step includes placing the device chips on the second device wafer from the first device wafer side and thereafter affixing a retrieval substrate to the support substrate with a thermosetting adhesive, and the peeling step includes heating the thermoplastic adhesive to reduce the bonding strength of the thermoplastic adhesive and peeling off the support substrate together with the retrieval substrate from the first device wafer.

Preferably, the method of manufacturing laminated device chips further includes, after the peeling step and before the dividing step, encapsulating areas that do not overlap the first device wafer and that overlap the second device wafer with an encapsulating resin.

In the method of manufacturing laminated device chips according to the aspect of the present invention, the first device wafer that has been affixed to the support substrate is thinned down and cut along the first projected dicing lines. Then, the first device wafer as cut is affixed to the second device wafer, after which the support substrate is peeled off from the first device wafer. In this case, before the first device wafer that has been thinned down and made extremely thin is affixed to the second device wafer, the first device wafer remains supported on the support substrate, and the extremely thin first device wafer can be handled with ease. Therefore, the extremely thin first device wafer can easily and stably be affixed to the second device wafer. Furthermore, since the first device wafer is supported on the second device wafer, the support substrate can easily be peeled off from the extremely thin first device wafer.

Inasmuch as the first device wafer that has been made extremely thin remains supported on the support substrate or the second device wafer, the first device wafer can easily be thinned down and delivered, and can easily be affixed to the second device wafer. Before the first device wafer is affixed to the second device wafer, the first device wafer has been cut along the first projected dicing lines. Consequently, when the second device wafer is divided, the individual laminated device chips are manufactured.

According to the aspect of the present invention, therefore, there is provided a method of manufacturing laminated device chips including extremely thin device chips easily and stably.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
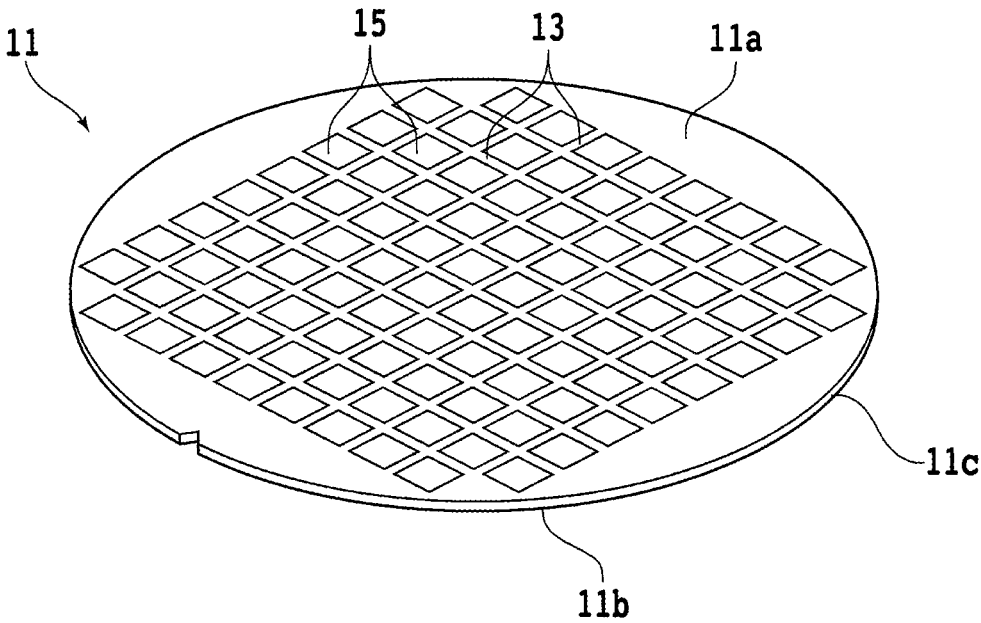
FIG. 1A is a perspective view schematically illustrating a first device wafer.
Figure 2A:
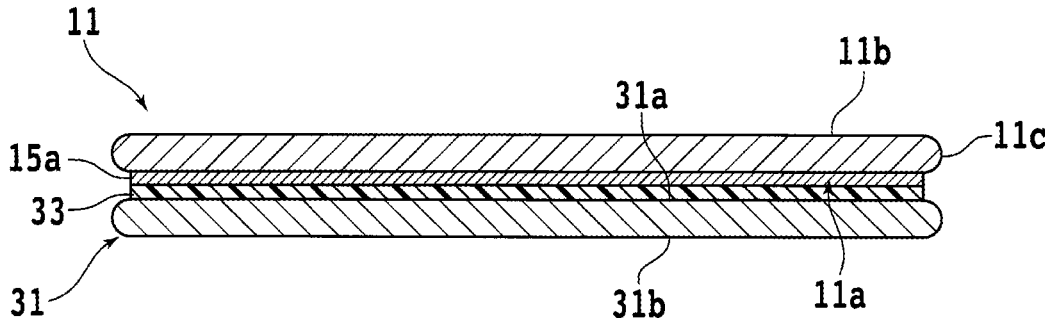
FIG. 2A is a cross-sectional view schematically illustrating the first device wafer that has been affixed to a support substrate.

A preferred embodiment of the present invention will be described below with reference to the accompanying drawings. First, a structural example of a first device wafer for use in a method of manufacturing laminated device chips according to the present embodiment will be described below. FIG. 1A schematically illustrates a first device wafer 11 in perspective. FIG. 2A schematically illustrates the first device wafer 11 in cross section. For example, the first device wafer 11 includes a circular wafer made of a semiconductor such as silicon and has a face side (first surface) 11a and a reverse side (second surface) 11b that lie generally parallel to each other. However, the first device wafer 11 is not limited to any materials, shapes, structures, sizes, etc. The first device wafer 11 may be in the form of a substrate made of any of semiconductors including GaAs, SiC, InP, GaN, etc. other than silicon, sapphire, glass, ceramic, resin, metal, or the like.

The first device wafer 11 includes a laminated body made up of a plurality of laminated thin films that is disposed in one side of the first device wafer 11 that has the face side 11a. The laminated thin films include various patterned thin films such as an electrically conductive film functioning as electrodes, interconnects, or terminals and an insulating film functioning as an interlayer insulating film. The laminated body extends to provide the entire face side 11a of the first device wafer 11. In the cross-sectional views of FIG. 2A and other figures, the laminated body including the laminated thin films of the first device wafer 11 is illustrated as a functional layer (first functional layer) 15a.

As illustrated in FIG. 1A, the first device wafer 11 has a plurality of rectangular areas demarcated in the face side 11a by a grid of first projected dicing lines or streets 13 established therein. The rectangular areas contain respective first devices 15 such as integrated circuits (ICs) or large-scaleintegration (LSI) circuits. The first devices 15 are not limited to any types, quantities, shapes, structures, sizes, layouts, etc.

As illustrated in FIG. 2A, the first devices 15 are provided by respective portions of the functional layer 15a that are contained in the rectangular areas surrounded by the first projected dicing lines 13. For example, the face side 11a of the first device wafer 11 and the thin films included in the functional layer 15a make up semiconductor devices. The thin films included in the functional layer 15a include portions that extend over the first projected dicing lines 13.

Figure 1B:
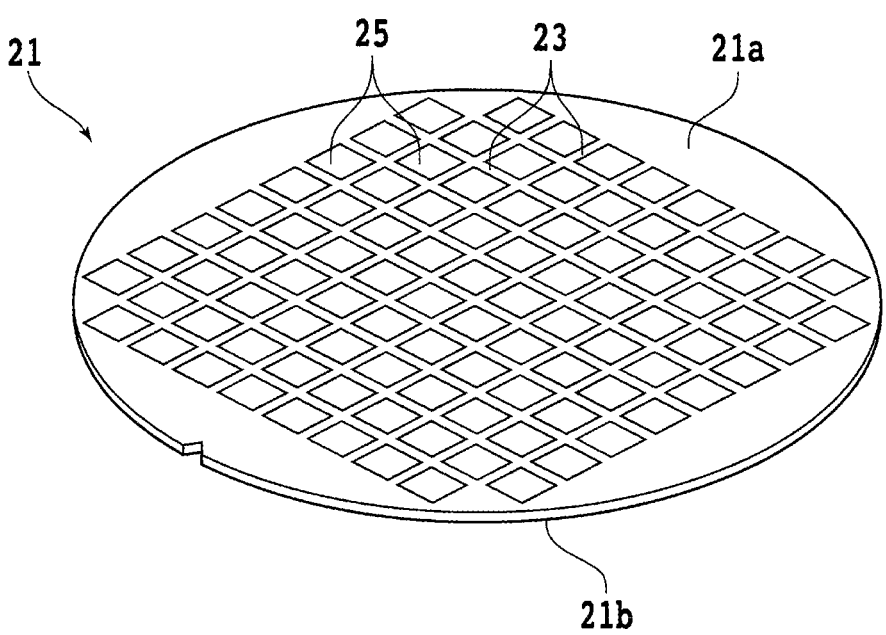
FIG. 1B is a perspective view schematically illustrating a second device wafer.
Figure 5A:
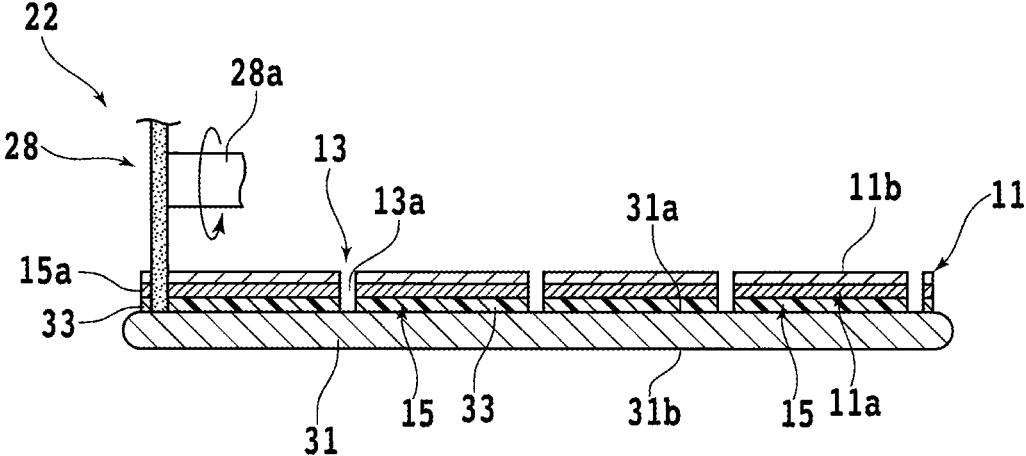
FIG. 5A is a cross-sectional view schematically illustrating the first device wafer that is being cut.
Figure 5B:
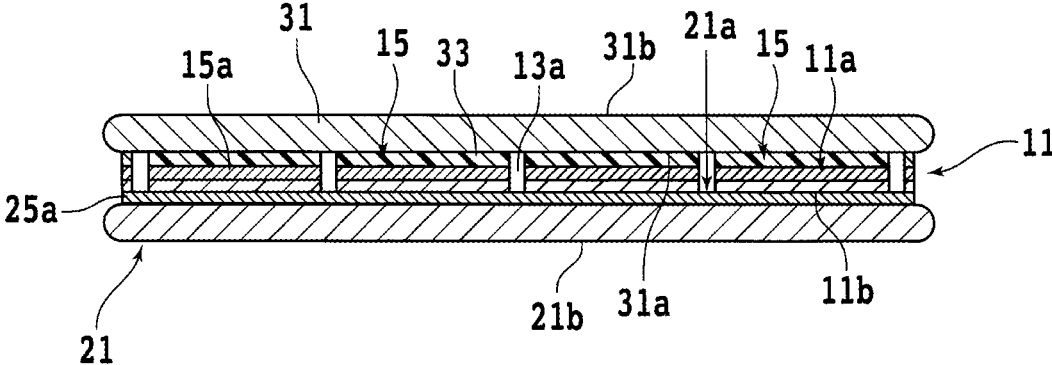
FIG. 5B is a cross-sectional view schematically illustrating the first device wafer that has been affixed to the second device wafer.

In the method of manufacturing laminated device chips according to the present embodiment, a second device wafer is affixed to the first device wafer 11. FIG. 1B schematically illustrates the second device wafer, denoted by 21, in cross section. FIG. 5B also schematically illustrates the second device wafer 21 in cross section. The second device wafer 21 has a face side 21a and a reverse side 21b that generally parallel to each other. Various thin films are laminated as a laminated body in one side of the second device wafer 21 that has the face side 21a. In the cross-sectional views of FIG. 5B and other figures, the laminated body including the laminated thin films of the second device wafer 21 is illustrated as a functional layer (second functional layer) 25a. The second device wafer 21 has a plurality of rectangular areas demarcated in the face side 21a by a grid of first projected dicing lines or streets 23 established therein. The rectangular areas contain respective second devices 25.

The second device wafer 21 should preferably, but not necessarily, be identical in structure to the first device wafer 11. The second devices 25 should preferably, but not necessarily, be identical in structure to the first devices 15. The layout of the second devices 25 of the second device wafer 21 should preferably, but not necessarily, be identical to the layout of the first devices 15 of the first device wafer 11.

The method of manufacturing laminated device chips according to the present embodiment may involve one or more other device wafers in addition to the first device wafer 11 and the second device wafer 21. The one or more other device wafers may be identical in structure to the first device wafer 11 and the second device wafer 21. The first device wafer 11 and the second device wafer 21 will be described later as being laminated and divided into laminated device chips. When the first device wafer 11 and the second device wafer 21 are thus processed, the one or more other wafers may be laminated on the second device wafer 21.

In the method of manufacturing laminated device chips according to the present embodiment, as illustrated in FIG. 2A, a support substrate 31 is affixed to the first device wafer 11 so that they are integrally combined with each other. The support substrate 31 may be of the same planar shape, size, and thickness as the first device wafer 11. The support substrate 31 may be made of a semiconductor material such as silicon, glass, resin, or ceramic. The support substrate 31 should preferably be of a thickness of 500 μm or larger in order to support the first device wafer 11 stably. However, the support substrate 31 is not limited such a thickness.

The support substrate 31 is required to have a certain or higher level of thickness uniformity so that a thinning process, to be described later, will highly accurately be performed on the first device wafer 11. The support substrate 31 has a face side 31a and a reverse side 31b that lie generally parallel to each other. The face side 31a and the reverse side 31b of the support substrate 31 are required to have a certain or higher level of planarity. For example, the support substrate 31 should preferably have a level of thickness uniformity that is the same as or higher than the first device wafer 11. The face side 31a and the reverse side 31b of the support substrate 31 should preferably have a level of planarity that is the same as or higher than the face side 11a and the reverse side 11b of the first device wafer 11.

Figure 11:
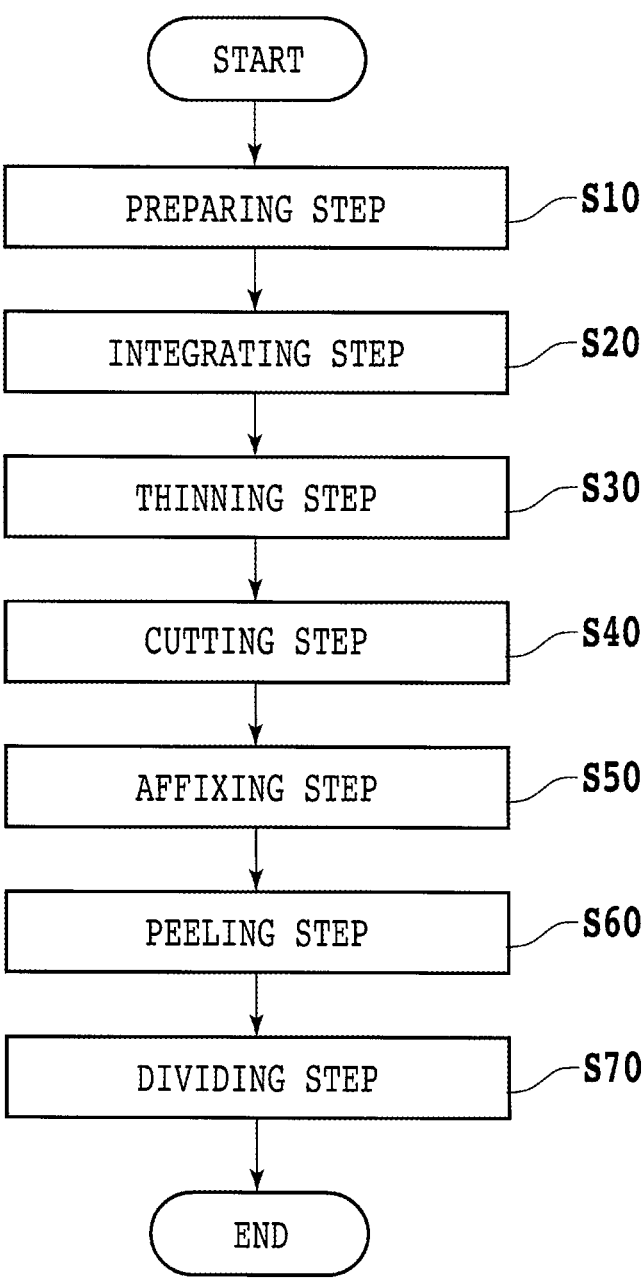
FIG. 11 is a flowchart of a sequence of steps of a method of manufacturing laminated device chips according to an embodiment of the present invention.

The steps of the method of manufacturing laminated device chips, also referred to as "manufacturing method," according to the present embodiment will be described below. FIG. 11 is a flowchart of a sequence of steps of the method of manufacturing laminated device chips according to the present embodiment. According to the manufacturing method, the first device wafer 11 is thinned down and then laminated on the second device wafer 21.

According to the manufacturing method, preparing step S10 is first carried out. In preparing step S10, the first device wafer 11, the second device wafer 21, and the support substrate 31 are prepared. In preparing step S10, the first device wafer 11 including the first devices 15 may be prepared, or the first devices 15 may be constructed on a semiconductor wafer, thereby providing the first device wafer 11. The second device wafer 21 is similarly prepared.

Then, in preparation for thinning down the first device wafer 11, integrating step S20 is carried out to affix the support substrate 31 to the face side 11a of the first device wafer 11 so that they are integrally combined with each other. FIG. 2A schematically illustrates integrating step S20 in cross section. In integrating step S20, for example, the support substrate 31 is placed on a table, not illustrated, with the reverse side 31b facing downwardly. Then, the first device wafer 11 is placed on and affixed to the face side 31a of the support substrate 31.

Specifically, the first device wafer 11 is carried to a position above the support substrate 31 where the face side 11a faces the support substrate 31, and then is lowered into contact with the support substrate 31. An adhesive 33 has been applied to the face side 31a of the support substrate 31 or the face side 11a of the first device wafer 11. Therefore, the first device wafer 11 and the support substrate 31 are affixed to each other by the adhesive 33 and hence integrally combined with each other. The adhesive 33 is present between the first device wafer 11 and the support substrate 31 as a layer that may be of a thickness ranging from several μm to several tens μm. The adhesive 33 may include an epoxy-based, acryl-based, silicone-based, or polyimide-based adhesive, or a resin such as a thermoplastic resin, a thermosetting resin, or an ultraviolet-curable resin. However, the adhesive 33 is not limited to those adhesives and resins. The adhesive 33 will be described in detail later.

After integrating step S20, thinning step S30 is carried out to thin down the first device wafer 11 to a predetermined thickness by processing the first device wafer 11 from the reverse side 11b. The process that is performed in thinning step S30 is not limited to any processes, though it may be a grinding process, a polishing process, a chemical mechanical polishing (CMP) process, or the like. A grinding process for grinding the first device wafer 11 in thinning step S30 will be described below. However, thinning step S30 is not limited to such a grinding process.

Figure 3:
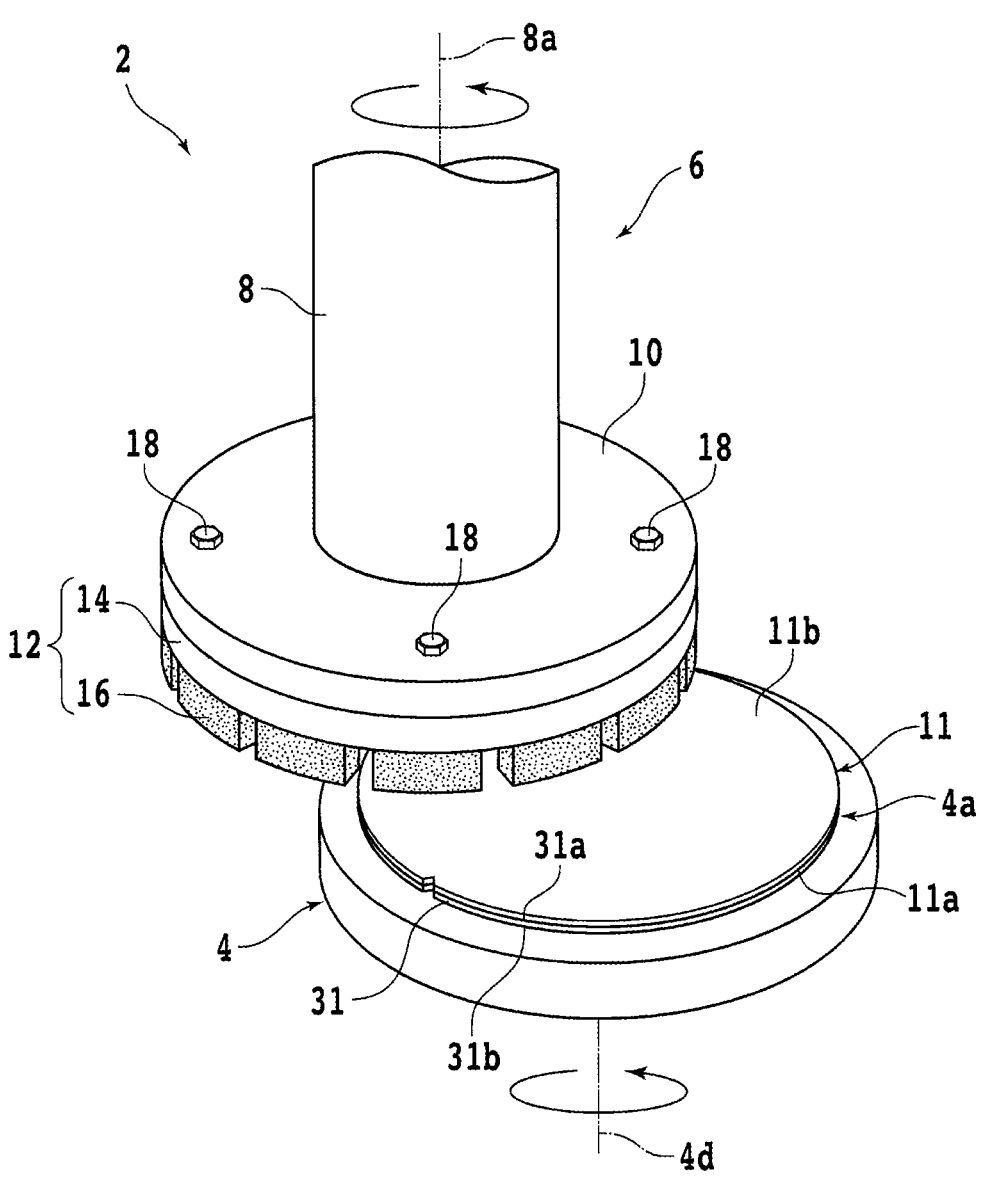
FIG. 3 is a perspective view schematically illustrating the first device wafer that is being thinned down by a grinding apparatus.

FIG. 3 schematically illustrates parts of a grinding apparatus 2 that carries out thinning step S30. First, the grinding apparatus 2 will be described below. The grinding apparatus 2 includes a chuck table 4 for holding under suction a workpiece such as the first device wafer 11 supported on the support substrate 31 and a grinding unit 6 for grinding the workpiece held under suction on the chuck table 4.

The chuck table 4 has a suction channel, not illustrated, defined therein that has an end fluidly connected to a suction source, not illustrated, such as an ejector. The chuck table 4 includes a circular porous member, not illustrated, exposed in an upper surface thereof. The suction channel has the other end fluidly connected to the porous member. The porous member is essentially identical in diameter to the support substrate 31. The upper surface of the chuck table 4 where the porous member is exposed functions as a holding surface 4a. When the support substrate 31 that supports the first device wafer 11 is placed on the holding surface 4a and then the suction source is actuated, the support substrate 31 is held under suction on the chuck table 4 by suction forces transmitted from the suction source through the suction channel to the porous member. The chuck table 4 is rotatable about its rotational axis 4d perpendicular to the holding surface 4a by a rotary actuator such as an electric motor connected to the chuck table 4.

The grinding unit 6 is vertically movable, i.e., can be lifted and lowered, by a lifting and lowering mechanism, not illustrated, that supports the grinding unit 6. The grinding unit 6 includes a spindle 8 extending substantially perpendicularly to the holding surface 4a and having an upper end coupled to a rotary actuator, not illustrated, such as an electric motor. When the rotary actuator is energized, it rotates the spindle 8 about its rotational axis 8a.

The spindle 8 has a lower end coupled to an upper surface of a disk-shaped wheel mount 10. A grinding wheel 12 is fixed to a lower surface of the wheel mount 10. The grinding wheel 12 includes an annular wheel base 14 made of a metal such as aluminum and having a diameter commensurate with the diameter of the first device wafer 11. The grinding wheel 12 also includes an annular array of grindstones 16 mounted on an outer circumferential portion of a lower surface, i.e., a bottom surface, of the wheel base 14. Each of the grindstones 16 is fabricated by sintering a mixture of abrasive grains of diamond, cubic boron nitride (CBN), or the like and a binder such as a vitrified binder or a resinoid binder, for example.

The wheel mount 10 has a plurality of grinding wheel securing holes extending vertically therethrough, and the wheel base 14 has as many fastening holes defined therein as the number of the grinding wheel securing holes. The grinding wheel 12 is secured to the wheel mount 10 by inserting fasteners 18 such as bolts through the grinding wheel securing holes into the respective fastening holes and tightening the fasteners 18.

In thinning step S30, the first device wafer 11 supported on the support substrate 31 is placed on the holding surface 4a of the chuck table 4. At this time, the reverse side 31b of the support substrate 31 faces the holding surface 4a, and the reverse side 11b of the first device wafer 11 is exposed upwardly, as illustrated in FIG. 3. The chuck table 4 then holds under suction the support substrate 31 by the suction forces acting on the reverse side 31b. Thereafter, the rotary actuator connected to the spindle 8 is energized, rotating the spindle 8 about the rotational axis 8a. The spindle 8 rotates the wheel mount 10 and hence the grinding wheel 12, causing the grindstones 16 to move along a rotary track along the outer circumferential portion of the wheel base 14. At this time, the rotary actuator connected to the chuck table 4 is also energized to rotate the chuck table 4 about the rotational axis 4d. The lifting and lowering mechanism that supports the grinding unit 6 is actuated to lower the grinding unit 6 to bring the bottom surfaces of the grindstones 16 as they move along the rotary track into abrasive contact with the surface to be ground, i.e., the reverse side 11b, of the first device wafer 11. The first device wafer 11 is now ground and gradually thinned down by the grindstones 16. The thickness of the first device wafer 11 as it is ground is monitored.

When the first device wafer 11 is thinned down to a predetermined thickness, the lifting and lowering mechanism stops lowering the grinding unit 6. In this manner, the first device wafer 11 that has been thinned down to the predetermined thickness is obtained.

While the first device wafer 11 is being ground from the reverse side 11b, the first devices 15 on the face side 11a are protected by the support substrate 31. Therefore, the support substrate 31 functions as a protective member. Since the first device wafer 11 that is being ground and thinned down is securely and stably supported by the support substrate 31, the first device wafer 11 can be thinned down to a thickness of 10 μm or less by being ground.

Figure 2B:
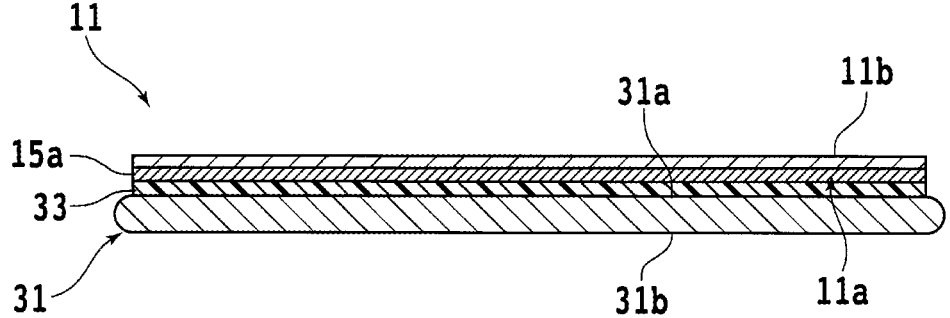
FIG. 2B is a cross-sectional view schematically illustrating the first device wafer that has been thinned down.

FIG. 2B schematically illustrates in cross section the first device wafer 11 that has been thinned down. The first device wafer 11 has an outer circumferential edge 11c (see FIG. 1A) that is of a beveled structure with corners cut off in order to prevent the first device wafer 11 from being chipped, cracked, or otherwise damaged. If the first device wafer 11 with the beveled outer circumferential edge 11c is thinned down by being ground, then the outer circumferential edge 11c changes to a knife-edge shape due to the beveled structure and tends to be chipped or cracked easily. To alleviate the drawback, an edge trimming process may be performed on the first device wafer 11 to remove the beveled structure from the outer circumferential edge 11c before the first device wafer 11 is ground. If the beveled structure has been removed from the outer circumferential edge 11c before the first device wafer 11 is ground, then the outer circumferential edge 11c does not change to a knife-edge shape when the first device wafer 11 is ground.

In the method of manufacturing laminated device chips according to the present embodiment, cutting step S40 is carried out to cut the first device wafer 11 by forming cut grooves in the first device wafer 11 along the first projected dicing lines 13 before or after thinning step S30. Cutting step S40 is performed by a processing apparatus such, for example, as a cutting apparatus having an annular cutting blade or a laser processing apparatus that applies a focused laser beam to a workpiece to process the workpiece with the focused laser beam. Cutting step S40 that is carried out using a cutting apparatus will be described below. However, cutting step S40 may be carried out using other processing apparatus.

Figure 4:
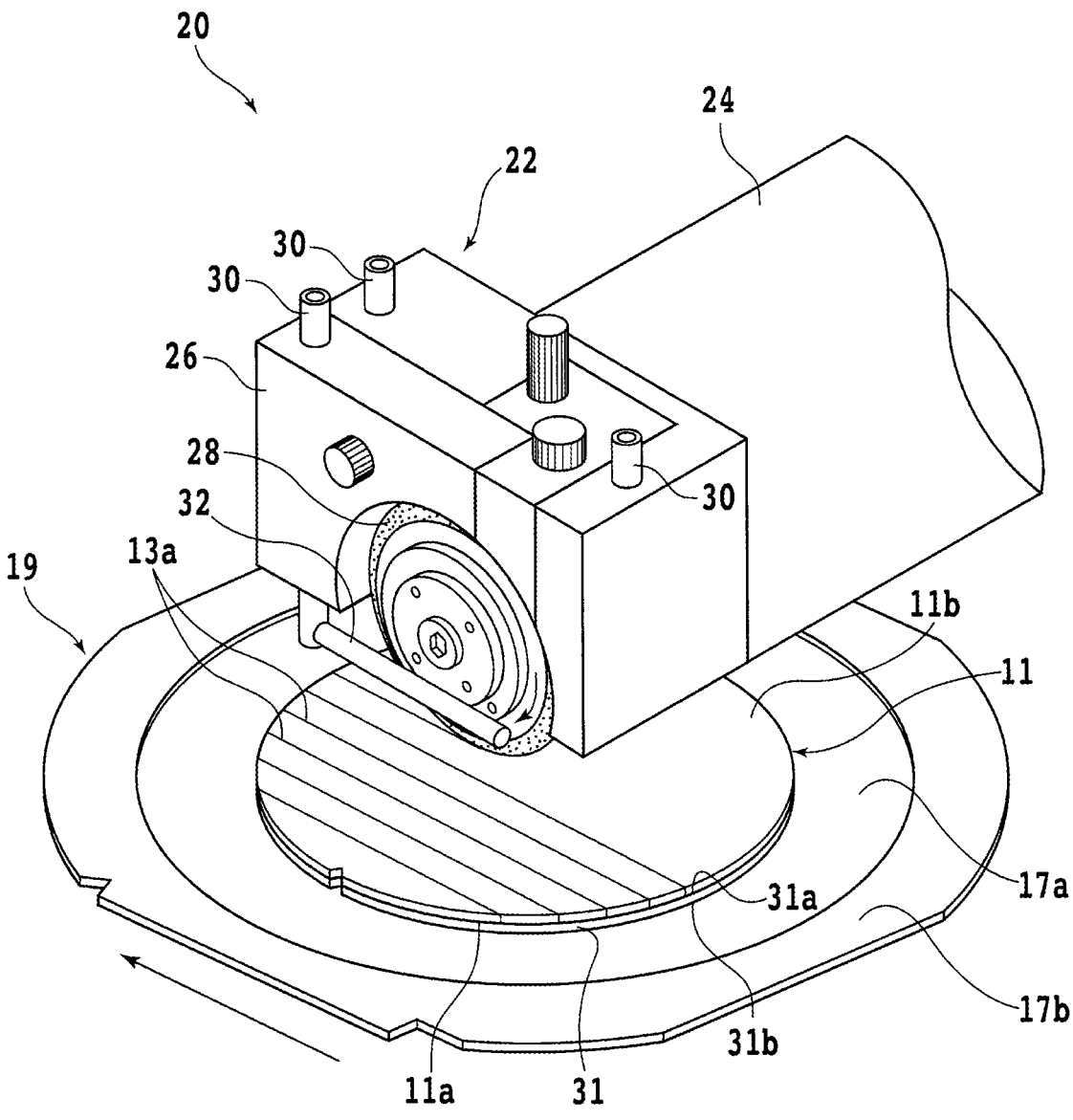
FIG. 4 is a perspective view schematically illustrating the first device wafer that is being cut by a cutting apparatus.

The cutting apparatus used in cutting step S40 will first be described below. FIG. 4 schematically illustrates in perspective parts of the cutting apparatus, denoted by 20, including a cutting unit 22. The cutting apparatus 20 includes a chuck table, not illustrated, for holding a workpiece thereon. The chuck table of the cutting apparatus 20 is identical in structure to the chuck table 4 of the grinding apparatus 2 illustrated in FIG. 3, and the detailed description will be omitted.

The cutting unit 22 includes an annular cutting blade 28 for cutting the workpiece on the chuck table. The cutting unit 22 includes a spindle housing 24 in which a proximal end portion of a spindle 28a (see FIG. 5A) is rotatably housed for rotation about a rotational axis extending parallel to the holding surface of the chuck table. The spindle housing 24 also houses therein a rotary actuator such as an electric motor connected to the spindle 28a for rotating the spindle 28a about the rotational axis. When the rotary actuator is energized, it rotates the spindle 28a about the rotational axis. The spindle 28a has a distal end on which the annular cutting blade 28 is fixedly mounted. Therefore, when the spindle 28a is rotated about the rotational axis, the cutting blade 28 is also rotated about the rotational axis. The cutting blade 28 includes an annular grindstone edge made of an annular binder member of a metal material or a resin material and abrasive grains of diamond or the like that are dispersed and secured in the annular binder member.

When the cutting blade 28 cuts the workpiece, swarf and heat are produced from the grindstone edge and the workpiece. At this time, processing water, i.e., cutting water, such as pure water is supplied to the cutting blade 28 and the workpiece to remove the swarf and the heat from the cutting blade 28 and the workpiece. As illustrated in FIG. 4, the cutting unit 22 also includes a blade cover 26 that covers the cutting blade 28 and a processing water supply nozzle 32 connected to the blade cover 26. The blade cover 26 houses therein a processing water ejection nozzle, not illustrated, for ejecting the processing water to the cutting blade 28. The processing water is supplied from the processing water supply nozzle 32 and the processing water ejection nozzle to the cutting blade 28. The blade cover 26 further houses therein a fluid delivery channel, not illustrated, having an outlet end connected to the processing water supply nozzle 32 and the processing water ejection nozzle and an inlet end connected to a joint 30 on an upper surface of the blade cover 26. The joint 30 is supplied with the processing water from an external processing water source.

FIG. 4 also schematically illustrates in perspective the first device wafer 11 that is being cut by the cutting blade 28. FIG. 5A schematically illustrates in cross section the first device wafer 11 that is being cut by the cutting blade 28. As illustrated in FIG. 4, the first device wafer 11 held on the chuck table may be integrally combined with a circular dicing tape 17a and a ring frame 17b made of a metal or the like. Specifically, the first device wafer 11 supported on the support substrate 31 is positioned in the opening of the ring frame 17b and affixed to the dicing tape 17a that has an outer circumferential portion affixed to the ring frame 17b. The first device wafer 11 supported on the support substrate 31, the dicing tape 17a, and the ring frame 17b are integrally combined into a frame unit 19. The first device wafer 11 as it is included in the frame unit 19 may be cut by the cutting unit 22. However, the first device wafer 11 is not limited to being combined with the dicing tape 17a and the ring frame 17b when it is cut in cutting step S40.

In cutting step S40, the first device wafer 11 supported on the support substrate 31 is held under suction on the chuck table, not illustrated, of the cutting apparatus 20. Then, the rotary actuator connected to the spindle 28a is energized to rotate the cutting blade 28 about the rotational axis, and the cutting blade 28 is lowered to a predetermined height. Then, the chuck table and the cutting unit 22 are moved relatively to each other horizontally, and the rotating cutting blade 28 is brought into contact with the first device wafer 11 along one of the first projected dicing lines 13, thereby cutting the first device wafer 11 along the first projected dicing line 13.

The cutting apparatus 20 includes an image capturing unit, not illustrated, that is capable of capturing an image of the face side 11a through the first device wafer 11. While the cutting apparatus 20 is in operation, the image capturing unit detects the first device wafer 11 in its captured image, and the cutting blade 28 cuts the first device wafer 11 along one of the first projected dicing lines 13, forming a cut groove 13a in the first device wafer 11 along the first projected dicing line 13. When cut grooves 13a are formed in the first device wafer 11 along all of the first projected dicing line 13, the first device wafer 11 is divided into individual device chips.

The relation between the height of the cutting blade 28 and the cut grooves 13a will be described hereinbelow.

When the cutting blade 28 cuts the first device wafer 11 while the lowermost end of the cutting blade 28 is being positioned at a position lower than the face side 11a that represents the lowermost end of the first device wafer 11, the cutting blade 28 can fully cut the first device wafer 11. In other words, when the cutting blade 28 reaches the support substrate 31 beyond the first device wafer 11, the cutting blade 28 can reliably cut the first device wafer 11. If the lowermost end of the cutting blade 28 does not reach the reverse side 31b of the support substrate 31 at this time, then the cutting blade 28 does not divide the support substrate 31. In this case, the individual device chips into which the first device wafer 11 has been divided remain supported on the support substrate 31 that is undivided. On the other hand, if the lowermost end of the cutting blade 28 reaches the reverse side 31b of the support substrate 31, then the cutting blade 28 cuts the support substrate 31 as well as the first device wafer 11. In this case, the individual device chips can freely be handled together with the respective pieces divided from the support substrate 31, and hence can be relocated.

Now, subsequent steps of the method of manufacturing laminated device chips according to the present embodiment will be described below first with respect to an example in which the cut grooves 13a formed in cutting step S40 do not extend into the support substrate 31, i.e., do not cut the support substrate 31. Then, subsequent steps of the method of manufacturing laminated device chips according to the present embodiment will also be described with respect to an example in which the cut grooves 13a formed in cutting step S40 extend through the support substrate 31, i.e., cut the support substrate 31.

In the method of manufacturing laminated device chips according to the present embodiment, cutting step S40 is followed by affixing step S50 that affixes the first device wafer 11 as cut to the second device wafer 21. FIG. 5B schematically illustrates in cross section the first device wafer 11 that has been affixed to the second device wafer 21.

For affixing the first device wafer 11 to the second device wafer 21, the first device wafer 11 supported on the support substrate 31 is carried to a position above the support substrate 31 where the face side 11a faces the support substrate 31. The first device wafer 11 and the support substrate 31 are vertically inverted, i.e., turned upside down, orienting the reverse side 11b of the first device wafer 11 in facing relation to the face side 21a of the second device wafer 21. Then, the first devices 15 in the face side 11a of the first device wafer 11 and the second devices 25 in the face side 21a of the second device wafer 21 are positionally aligned with each other. Thereafter, the first device wafer 11 is lowered and affixed to the second device wafer 21. In affixing step S50, the first device wafer 11 and the second device wafer 21 are affixed to each other by either an organic material or an inorganic material interposed therebetween or without these materials interposed therebetween, in the same manner as with the existing WoW process.

In a case where the layout of the first devices 15 in the first device wafer 11 and the layout of the second devices 25 in the second device wafer 21 do not match each other, the above process fails to position the first devices 15 in alignment with the second devices 25. Consequently, the support substrate 31 is cut or divided as described later, and the first devices 15 contained in the respective device chips are relocated into alignment with the second devices 25.

In affixing step S50, the first devices 15 in the first device wafer 11 and the second devices 25 in the second device wafer 21 may be electrically connected to each other by electrodes, interconnect layers, etc. The first devices 15 and the second devices 25 may be electrically connected according to existing processes.

Figure 6A:
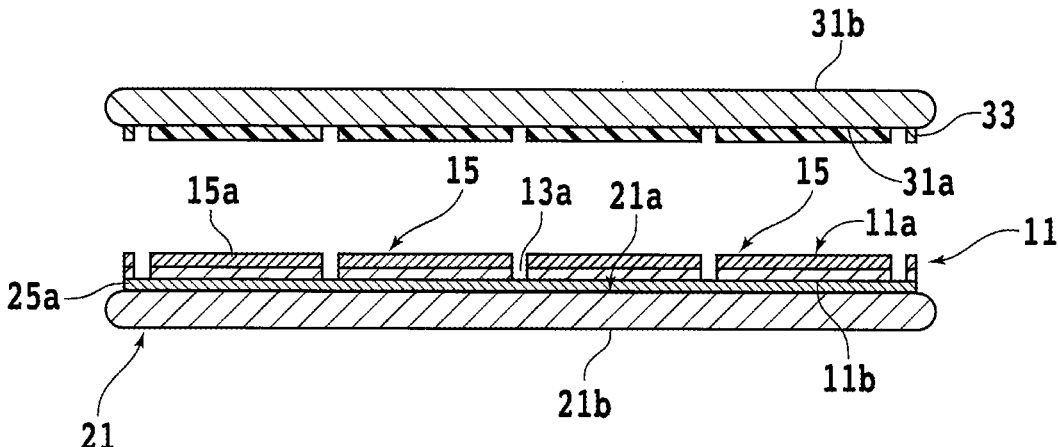
FIG. 6A is a cross-sectional view schematically illustrating the support substrate that is peeled off from the first device wafer.

Affixing step S50 is followed by peeling step S60 that peels off the support substrate 31 from the first device wafer 11 that has been cut. FIG. 6A schematically illustrates in cross section the manner in which the support substrate 31 is peeled off from the first device wafer 11 in peeling step S60. If the support substrate 31 has been affixed to the first device wafer 11 by the adhesive 33 in integrating step S20, then it is preferable to perform a process of reducing the bonding strength of the adhesive 33 in peeling step S60. Once the bonding strength of the adhesive 33 has been reduced, the support substrate 31 can easily be peeled off from the first device wafer 11. The process of reducing the bonding strength of the adhesive 33 needs to be carried out in a manner suited to the properties of the adhesive 33.

Specifically, if the adhesive 33 is made of a thermoplastic resin, for example, then the adhesive 33 may be heated to reduce its adhesive power. More specifically, the integral assembly of the support substrate 31, the first device wafer 11, and the second device wafer 21 is placed on a hot plate, and then the hot plate is energized to heat the adhesive 33. Alternatively, hot air may be ejected from a heat gun or the like, or infrared rays may be applied, to the support substrate 31 etc. to heat the adhesive 33. If the adhesive 33 is made of an ultraviolet (UV)-curable resin, for example, then ultraviolet rays may be applied through the support substrate 31 to the adhesive 33. In this case, the support substrate 31 needs to be made of a material that is transmissive of ultraviolet rays. The process of reducing the bonding strength of the adhesive 33 in peeling step S60 is not limited to any of the above methods, but may be carried out by other methods. Other examples of the process of reducing the bonding strength of the adhesive 33 will be described in detail later.

In peeling step S60, thereafter, the support substrate 31 is peeled off from the first device wafer 11. The first device wafer 11 as divided into the individual device chips is now supported on the second device wafer 21. In this manner, the first device wafer 11 as thinned down and divided into the individual device chips remains supported on one of or both the support substrate 31 and the second device wafer 21. Consequently, even if the first device wafer 11 has been thinned down to the thickness of 10 μm or less in thinning step S30, the first device wafer 11 can be handled with ease.

Figure 6B:
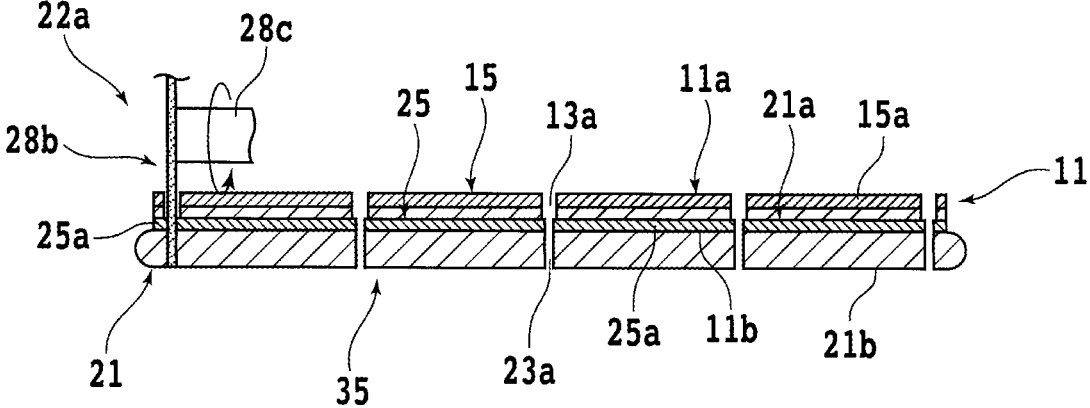
FIG. 6B is a cross-sectional view schematically illustrating the second device wafer that is being divided by a cutting unit.

In the method of manufacturing laminated device chips according to the present embodiment, after peeling step S60, dividing step S70 is carried out to divide the second device wafer 21 along second projected dicing lines 23 (see FIG. 1B) thereon into a plurality of individual laminated device chips. FIG. 6B schematically illustrates in cross section the second device wafer 21 that has been divided. The second device wafer 21 is divided in dividing step S70 by a processing apparatus such, for example, as a cutting apparatus having an annular cutting blade or a laser processing apparatus that applies a focused laser beam to a workpiece to process the workpiece with the focused laser beam. Dividing step S70 that is carried out to cut the second device wafer 21 using a cutting apparatus including a cutting unit 22a that is structurally identical to the cutting apparatus including the cutting unit 22 illustrated in FIGS. 4 and 5A will be described below. However, dividing step S70 is not limited to the details to be described below. The above description of the cutting unit 22 can be referred to in the description to be given below of the cutting unit 22a.

As illustrated in FIG. 6B, the cutting unit 22a includes a spindle 28c and a cutting blade 28b mounted on a distal end of the spindle 28c. The cutting blade 28b of the cutting unit 22a illustrated in FIG. 6B has an edge thickness smaller than the edge thickness of the cutting blade 28 (see FIG. 5A) of the cutting apparatus 20 used in cutting step S40. However, the edge thickness of the cutting blade 28b may not necessarily be smaller than the edge thickness of the cutting blade 28.

In dividing step S70, the rotating cutting blade 28b is caused to cut into the second device wafer 21 along the second projected dicing lines 23. In particular, the rotating cutting blade 28b should cut into the second device wafer 21 in areas overlapping the cut grooves 13a formed in the first device wafer 11 along the first projected dicing lines 13. At this time, the height of the cutting blade 28b is adjusted in advance such that the height of the lowermost end of the cutting blade 28b is equal to or smaller than the height of the reverse side 21b of the second device wafer 21. When the cutting blade 28b has cut into the second device wafer 21 along all of the second projected dicing lines 23, cut grooves 23a are formed in the second device wafer 21 along all of the second projected dicing lines 23, dividing the second device wafer 21 into individual laminated device chips 35 each including one of the first devices 15 and one of the second devices 25. Even if the first device wafer 11 has been thinned down to the thickness of 10 μm or less in thinning step S30, the first device wafer 11 remains securely and stably supported on the second device wafer 21. Consequently, the laminated device chips 35 including ultrathin device chips can easily be fabricated from the first device wafer 11 and the second device wafer 21.

In the method of manufacturing laminated device chips according to the present embodiment, only the first device wafer 11 is cut, and the support substrate 31 remains uncut in cutting step S40. However, the support substrate 31 may also be cut together with the first device wafer 11 in cutting step S40, so that device chips including respective pieces divided from the support substrate 31 and respective pieces divided from the first device wafer 11 may be fabricated. A modification of the method of manufacturing laminated device chips according to the present embodiment will be described below.

The details of the modification that are identical to those of the above manufacturing method according to the present embodiment will be omitted from detailed description. Therefore, the above description of the steps of the manufacturing method according to the present embodiment can be referred to in the description of the modification. According to the modification, preparing step S10 and integrating step S20 are carried out. In integrating step S20, the support substrate 31 is affixed to the first device wafer 11 by the adhesive 33. Thereafter, thinning step S30 is carried out to thin down the first device wafer 11.

Figure 7A:
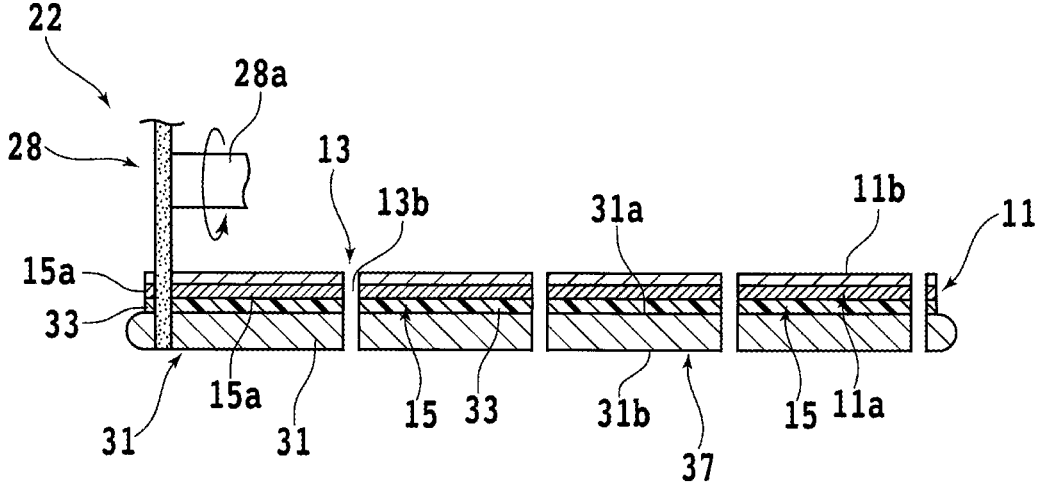
FIG. 7A is a cross-sectional view schematically illustrating the first device wafer and the support substrate that are being cut.

Then, cutting step S40 is carried out. FIG. 7A schematically illustrates cutting step S40 in cross section. In cutting step S40 illustrated in FIG. 7A, the height of the lowermost end of the rotating cutting blade 28 of the cutting apparatus is equal to or smaller than the height of the reverse side 31b of the support substrate 31. The cutting blade 28 thus cuts the support substrate 31 reliably. In cutting step S40, the cutting blade 28 cuts the first device wafer 11 and the support substrate 31 along the first projected dicing lines 13 thereof. At this time, since the support substrate 31 is fully cut together with the first device wafer 11, they are divided into individual device chips 37. Inasmuch as the pieces divided from the first device wafer 11 that has been thinned down in thinning step S30 remain supported on the respective pieces divided from the support substrate 31 in the respective device chips 37, the pieces divided from the thinned first device wafer 11 can be handled with ease.

Figure 7B:
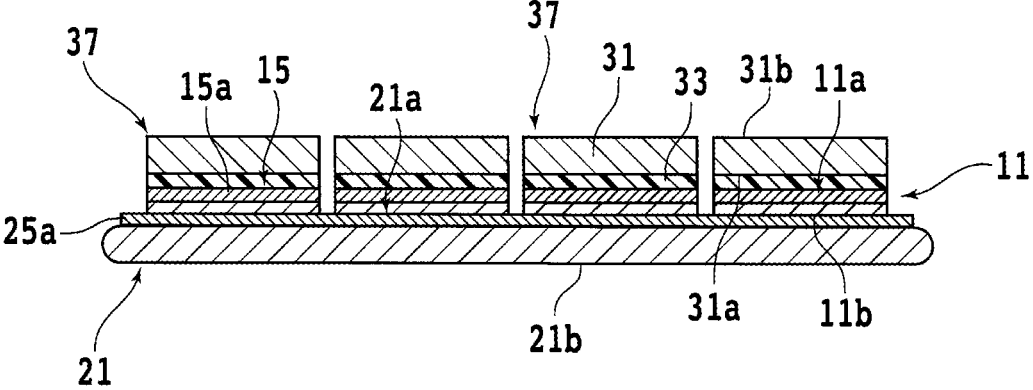
FIG. 7B is a cross-sectional view schematically illustrating the first device wafer that has been affixed to the second device wafer.

Then, affixing step S50 is carried out. FIG. 7B schematically illustrates in cross section the second device wafer 21 to which the device chips 37 have been affixed in affixing step S50. In affixing step S50, while the device chips 37 are being positionally adjusted in alignment with the respective second devices 25 in the face side 21a of the second device wafer 21, the device chips 37 are placed on the face side 21a of the second device wafer 21 such that the pieces divided from the first device wafer 11 face the face side 21a of the second device wafer 21.

Then, the pieces divided from the first device wafer 11 in the respective device chips 37 are affixed to the second device wafers 21. In a case where the first device wafer 11 and the support substrate 31 are fully cut and divided into the device chips 37 in cutting step S40 and the device chips 37 are individually affixed to the second device wafer 21, the first devices 15 can be laminated onto the second devices 25 regardless of the layout of the second devices 25 in the second device wafer 21 because the individual device chips 37 can be relocated. Accordingly, the layout of the first devices 15 in the first device wafer 11 and the layout of the second devices 25 in the second device wafer 21 are not required to match each other.

With the device chips 37 affixed to the second device wafer 21, the pieces divided from the support substrate 31 in the respective device chips 37 have respective reverse sides, which correspond to the reverse side 31b, exposed upwardly. In affixing step S50, thereafter, a tape 39 (see FIG. 8) is affixed to the reverse sides 31b of the pieces divided from the support substrate 31 in the respective device chips 37. The tape 39 is affixed to all of the device chips 37 that have been affixed to the second device wafer 21. The tape 39 will be used in peeling step S60 to be described below in order to peel off all of the pieces divided from the support substrate 31 from the respective pieces divided from the first device wafer 11 in the respective device chips 37. The tape 39 includes, for example, a circular film-shape base and an adhesive layer, i.e., a glue layer, deposited on the base. The base is made of a resin such as polyolefin, polyvinyl chloride, or polyethylene terephthalate. The adhesive layer includes an epoxy-based, an acryl-based, or a rubber-based adhesive, or the like.

Figure 8A:
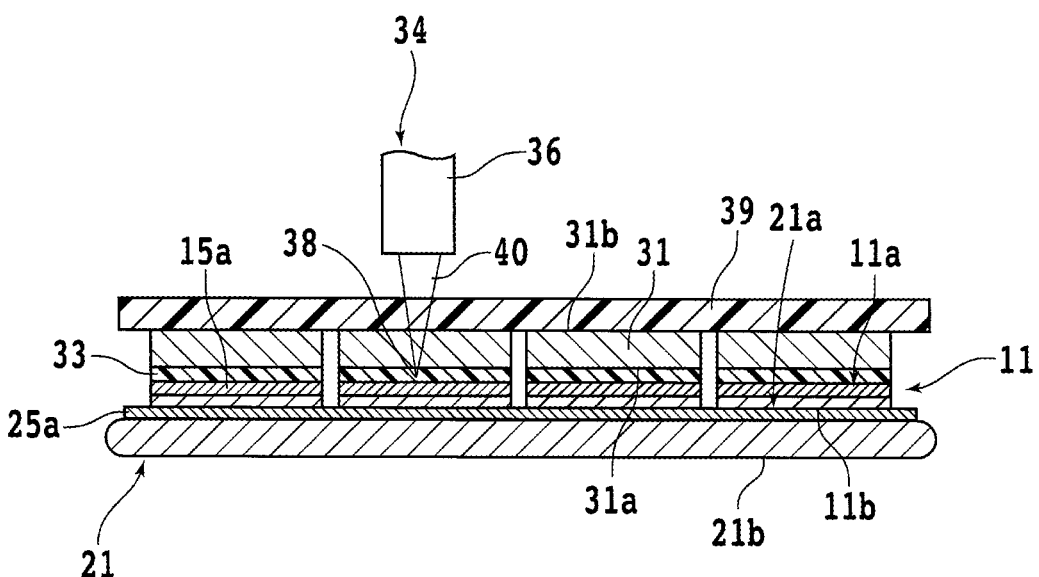
FIG. 8A is a cross-sectional view schematically illustrating the manner in which a laser beam is applied to an adhesive member by a laser processing apparatus.

Next, peeling step S60 is carried out. FIG. 8A schematically illustrates peeling step S60 in cross section. In peeling step S60, the bonding strength of the adhesive 33 may be reduced according to any of the methods described above. Alternatively, in peeling step S60, a laser beam 40 may be applied through the tape 39 and the support substrate 31 to the adhesive 33 to reduce the bonding strength of the adhesive 33.

The laser beam 40 may be applied to the adhesive 33 by a laser processing apparatus 34 that is fragmentarily illustrated in FIG. 8A. The laser processing apparatus 34 includes a chuck table, not illustrated, for holding a workpiece, i.e., the integral assembly of the second device wafer 21, the pieces divided from the first device wafer 11, the divided pieces of the support substrate 31, and the tape 39, under suction thereon and a processing head 36 for focusing the laser beam 40 onto the workpiece held under suction on the chuck table. The laser processing apparatus 34 also includes a processing feed unit, not illustrated, for moving the chuck table and the processing head 36 relatively to each other. Furthermore, the laser processing apparatus 34 includes a laser oscillator, not illustrated, such as Yttrium Aluminum Garnet (YAG) laser, Yttrium Vanadate (YVO$_4$) laser, or Yttrium Lithium Fluoride (YLF) laser. The processing head 36 houses therein an optical system for guiding the laser beam 40 emitted from the laser oscillator by way of pulsed laser oscillation onto the adhesive 33. The optical system includes an optical device such as a condensing lens for focusing the laser beam 40. When the laser beam 40 is focused onto the adhesive 33 by the processing head 36, the adhesive 33 is modified to reduce its bonding strength.

In peeling step S60, the integral assembly including the second device wafer 21 etc. is placed on the chuck table of the laser processing apparatus 34, and held under suction on the chuck table. Then, the relative heights of the processing head 36 and the chuck table are adjusted to align the height of a focused spot 38 of the laser beam 40 with the height of the adhesive 33. Thereafter, while the laser beam 40 is being focused from the processing head 36 into the focused spot 38, the processing head 36 and the chuck table are moved relatively to each other. The laser beam 40 is now caused to sweep all over the adhesive 33, reducing the bonding strength of the adhesive 33 in its entirety.

At this time, the laser beam 40 is applied through the tape 39 and the support substrate 31 to the adhesive 33. Therefore, the laser beam 40 should preferably have a wavelength capable of being transmitted through the tape 39 and the support substrate 31 and being absorbed by the adhesive 33. Stated otherwise, the tape 39 and the support substrate 31 should be made of materials through which the laser beam 40 can be transmitted, whereas the adhesive 33 should be made of a material that can be modified to reduce its bonding strength by the laser beam 40 applied thereto.

For example, in order to provide the adhesive 33 between the support substrate 31 and the first device wafer 11, the face side 11a of the first device wafer 11 is coated with a thermosetting resin, and the face side 31a of the support substrate 31 is coated with a UV-curable liquid adhesive "Light-to-Heat-Conversion Release Coating" manufactured by 3M Company. Thereafter, the first device wafer 11 and the support substrate 31 are affixed to each other by the adhesive 33 made up of the thermosetting resin and the liquid adhesive. When the laser beam 40 is applied to the portion of the adhesive 33 that derives from the liquid adhesive on the face side 31a of the support substrate 31, the bonding strength of the adhesive 33 is reduced.

Alternatively, a UV-curable tape "SELFA (Registered Trademark) Series" manufactured by SEKISUI CHEMICAL Co., Ltd. is sandwiched between the first device wafer 11 and the support substrate 31, and then ultraviolet rays are applied at a predetermined intensity level to the tape, turning the tape into the adhesive 33. When a laser beam 40 that has a wavelength belonging to the wavelength range of the ultraviolet rays is applied to the adhesive 33, the bonding strength of the adhesive 33 is reduced. In a case where the laser beam 40 whose wavelength belongs to the wavelength range of the ultraviolet rays is used, the support substrate 31 should be made of a material through which the laser beam 40 can be transmitted.

If a silicon wafer is used as the support substrate 31, then a laser beam 40 having a wavelength belonging to the wavelength range of infrared rays may be used in peeling step S60. However, the materials of the tape 39, the support substrate 31, and the adhesive 33 and the wavelength of the laser beam 40 are not limited to those described above.

After the laser beam 40 has been applied to the entire area of the adhesive 33 to reduce the bonding strength of the adhesive 33, the tape 39 is lifted off. As illustrated in FIG.

Figure 8B:
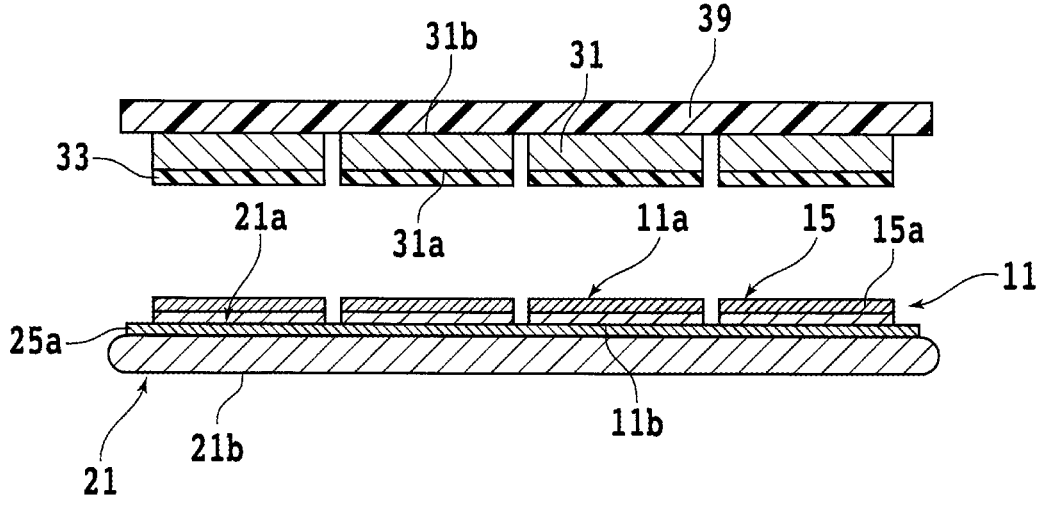
FIG. 8B is a cross-sectional view schematically illustrating the support substrate that has been peeled off from the first device wafer.

8B, the divided pieces of the support substrate 31 in the device chips 37 and the tape 39 are peeled off from the divided pieces of the first device wafer 11. FIG. 8B schematically illustrates in cross section the manner in which the divided pieces of the support substrate 31 are peeled off from the divided pieces of the first device wafer 11.

Figure 9A:
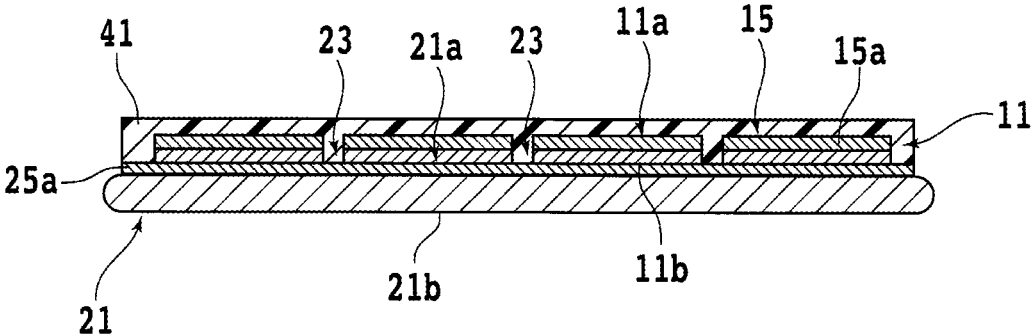
FIG. 9A is a cross-sectional view schematically illustrating the second device wafer that has been encapsulated by an encapsulating resin.

After peeling step S60 and before dividing step S70, the areas of the integral assembly of the divided pieces of the first device wafer 11 and the second device wafer 21 that do not overlap the divided pieces of the first device wafer 11 and that overlap the second device wafer 21 may be encapsulated by an encapsulating resin. However, the encapsulating resin may encapsulate the areas that overlap the divided pieces of the first device wafer 11. FIG. 9A schematically illustrates in cross section the divided pieces of the first device wafer 11 and the face side 21a of the second device wafer 21 that have been encapsulated by an encapsulating resin 41. Since the divided pieces of the first device wafer 11 and the face side 21a of the second device wafer 21 to be divided later have been encapsulated by the encapsulating resin 41, when the encapsulated assembly including the second device wafer 21 is divided into laminated device chips in dividing step S70, the laminated device chips have been packaged by the encapsulating resin 41. The areas that do not overlap the divided pieces of the first device wafer 11 and that overlap the second device wafer 21 as described above are basically aligned with the second projected dicing lines 23 of the second device wafer 21. To put it from a different angle, the areas represent zones where the face side 21a of the second device wafer 21 are exposed through the gaps between the divided pieces of the first device wafer 11 that are disposed on the second device wafer 21.

As long as the encapsulating resin 41 encapsulates the areas described above, the encapsulating resin 41 may be disposed on other areas including the areas overlapping the divided pieces of the first device wafer 11, and may encapsulate the divided pieces of the first device wafer 11. Furthermore, before the encapsulating resin 41 is deposited over the second device wafer 21, one or more other device wafers or divided device chips thereof may be laminated on the divided pieces of the first device wafer 11 on the second device wafer 21.

Figure 9B:
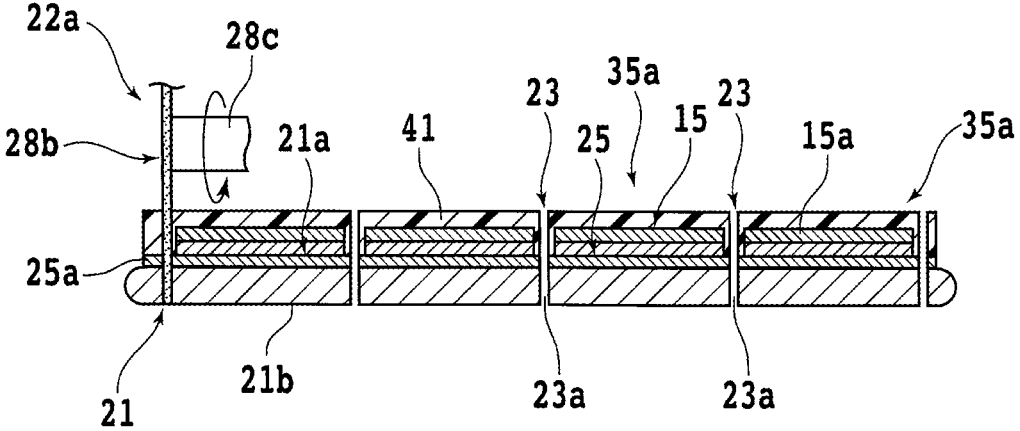
FIG. 9B is a cross-sectional view schematically illustrating the second device wafer that is being cut.

After peeling step S60 has been carried out and the divided pieces of the first device wafer 11 and the second device wafer 21 have been encapsulated by the encapsulating resin 41, dividing step S70 is carried out. FIG. 9B schematically illustrates the manner in which dividing step S70 is carried out. As illustrated in FIG. 9B, dividing step S70 is carried out by the cutting unit 22a illustrated in FIG. 9B. In dividing step S70, the cutting blade 28b of the cutting unit 22a cuts not only the second device wafer 21 but also the encapsulating resin 41. Therefore, the divided pieces of the first device wafer 11 and the second device wafer 21 that have been encapsulated by the encapsulating resin 41 are divided into individual laminated device chips 35a each encapsulated by the encapsulating resin 41.

As described above, after the support substrate 31 as well as the first device wafer 11 has been fully cut in cutting step S40, the pieces divided from the first device wafer 11 are affixed to the second device wafer 21. Therefore, even if the layout of the first devices 15 in the first device wafer 11 and the layout of the second devices 25 in the second device wafer 21 do not match each other, the first devices 15 can be laminated onto the second devices 25 because the first devices 15 combined with the divided pieces of the support substrate 31 can be relocated. When the laser beam 40 is applied to the adhesive 33 to reduce the bonding strength of the adhesive 33 in peeling step S60, the thermal effect of the laser beam 40 on other structural parts is minimized.

According to the modification, it has been described that the tape 39 is affixed to the support substrate 31, the laser beam 40 is applied to reduce the bonding strength of the adhesive 33, and the tape 39 is lifted off to peel off the support substrate 31 from the pieces divided from the first device wafer 11. However, in the method of manufacturing laminated device chips, the pieces divided from the support substrate 31 may be peeled off from the pieces divided from the first device wafer 11 according to another method. Another modification of the method of manufacturing laminated device chips according to the present embodiment will be described below.

Those steps of the other modification of the method of manufacturing laminated device chips according to the present embodiment that are identical to those described above will be omitted from detailed description. According to the other modification, preparing step S10 is carried out, then integrating step S20 is carried out, followed by thinning step S30 to thin down the first device wafer 11, and cutting step S40 is carried out. In integrating step S20, the support substrate 31 is affixed to the first device wafer 11 by an adhesive 33 including a thermoplastic adhesive. Then, as described above with reference to FIG. 7A, in cutting step S40, the support substrate 31 and the first device wafer 11 are fully cut and divided into device chips 37.

Next, affixing step S50 is carried out. In affixing step S50, as described above with reference to FIG. 7B, the device chips 37 are placed on the face side 21a of the second device wafer 21 such that the pieces divided from the first device wafer 11 face the face side 21a of the second device wafer 21. Then, the pieces divided from the first device wafer 11 are affixed to the second device wafer 21. Since the device chips 37 can be individually affixed to the second device wafer 21, the positions of the first devices 15 can positionally be adjusted with respect to the second devices 25.

Figure 10A:
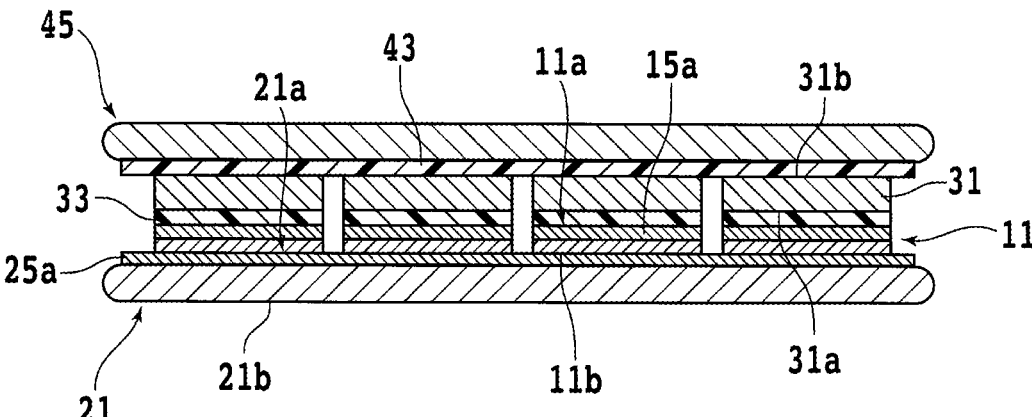
FIG. 10A is a cross-sectional view schematically illustrating a retrieval substrate that has been affixed to the support substrate.

In affixing step S50, thereafter, a retrieval substrate is affixed to the reverse side 31b of the support substrate 31 by an adhesive including a thermosetting adhesive. FIG. 10A schematically illustrates in cross section the manner in which a retrieval substrate 45 is affixed to the reverse side 31b of the support substrate 31 by an adhesive 43 including a thermosetting adhesive. For example, the retrieval substrate 45 includes a hard substrate made of a material such as glass, ceramic, or metal. Alternatively, the retrieval substrate 45 may include a semiconductor wafer without devices constructed thereon, a wafer that has been excluded in a process of manufacturing device chips, or the like.

As illustrated in FIG. 10A, the integral assembly of the second device wafer 21, the first device wafer 11, the support substrate 31, and the retrieval substrate 45 includes the adhesive 33 including a thermoplastic adhesive and the adhesive 43 including a thermosetting adhesive. More specifically, the adhesive 33 including a thermoplastic adhesive is used to affix the first device wafer 11 and the support substrate 31 to each other. On the other hand, the adhesive 43 including a thermosetting adhesive is used to affix the support substrate 31 and the retrieval substrate 45 to each other. Since the adhesives 33 and 43 are different in their properties, their bonding strengths become different from each other when the integral assembly including the second device wafer 21 etc. is heated to a predetermined temperature. In peeling step S60 to be described below, the different bonding strengths make it easy for the support substrate 31 to be peeled off from the first device wafer 11 and also make it difficult for the retrieval substrate 45 to be peeled off from the support substrate 31.

The adhesive 33 including a thermoplastic adhesive may be made of "ZONEBOND (Registered Trademark)" or "WAFERBOND (Registered Trademark)" manufactured by Brewer Science Inc. The adhesive 43 including a thermosetting adhesive may be made of a benzocyclobutene-based material typified by "CYCLOTENE (Registered Trademark)" manufactured by Dow Chemical Company. However, the adhesives 33 and 43 are not limited to these materials.

Figure 10B:
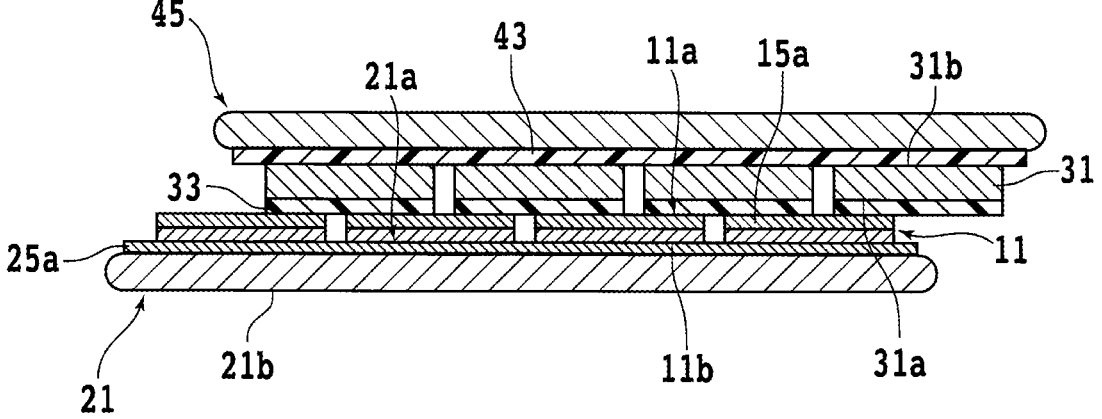
FIG. 10B is a cross-sectional view schematically illustrating the support substrate that is being peeled off from the first device wafer.

Then, peeling step S60 is carried out. FIG. 10B schematically illustrates in cross section the manner in which the support substrate 31 is peeled off from the first device wafer 11 in peeling step S60. In peeling step S60, the adhesive 33 including a thermoplastic adhesive is heated to reduce its bonding strength, and the support substrate 31 is peeled off from the first device wafer 11, along with the retrieval substrate 45. At this time, the bonding strength of the adhesive 43 including a thermosetting adhesive is not reduced.

For example, the integral assembly including the second device wafer 21 etc. is placed on a hot plate and heated thereby. Alternatively, hot air is ejected to the integral assembly to heat it. Further alternatively, infrared rays are applied to the integral assembly to heat it. The predetermined temperature, i.e., a target temperature, to which the integral assembly is heated is a temperature at which the adhesive 33 including a thermoplastic adhesive is softened, reducing its bonding strength, and also at which the bonding strength of the adhesive 43 including a thermosetting adhesive is not reduced.

When the retrieval substrate 45 is moved after the bonding strength of the adhesive 33 has been reduced, the support substrate 31 affixed to the first device wafer 11 is peeled off. Specifically, the pieces divided from the support substrate 31 that are part of the device chips 37 are retrieved all together while being affixed to the retrieval substrate 45. Therefore, the pieces divided from the support substrate 31 can be peeled off with utmost ease. Thereafter, dividing step S70 is carried out to divide the second device wafer 21, fabricating laminated device chips.

Using the adhesives 33 and 43 that are different in their properties makes it easy to peel off the support substrate 31 simply by heating the integral assembly including the second device wafer 21 etc. to the predetermined temperature and then removing the retrieval substrate 45. Since it is not necessary to use an expensive laser processing apparatus in this process, the cost of manufacturing laminated device chips is reduced. Furthermore, the retrieval substrate 45 used to retrieve the support substrate 31 can be reused by removing the retrieved support substrate 31 therefrom. Therefore, the cost of manufacturing laminated device chips is further reduced.

In the method of manufacturing laminated device chips according to the present embodiment, as described above, the thinned first device wafer 11 remains supported on at least one of the support substrate 31 or the second device wafer 21. Therefore, even when the first device wafer 11 is thinned down to a thickness that is so small that the first device wafer 11 is difficult to handle, the first device wafer 11 remains supported stably. Consequently, it is possible to fabricate laminated device chips 35 and 35a including device chips that derive from the extremely thinned first device wafer 11.

The present invention is not limited to the present embodiment described above, but various changes and modifications may be made therein. For example, according to the above embodiment, when the tape 39 is used as illustrated in FIG. 8A, the laser beam 40 is applied through the tape 39 to the adhesive 33. In other words, the tape 39 is affixed to the support substrate 31 before the laser beam 40 is applied to the adhesive 33. The present invention, however, is not limited to such a detail. The tape 39 may be affixed to the support substrate 31 after the laser beam 40 has been applied to the adhesive 33 to reduce the bonding strength thereof. In this case, since the laser beam 40 does pass through the tape 39, a greater choice is available of materials that the tape 39 may be made of. In other words, the tape 39 may be made of materials that can absorb the laser beam 40. Stated otherwise, a laser beam 40 that cannot pass through the tape 39 may be used to reduce the bonding strength of the adhesive 33. In other words, the laser beam 40 can be applied under a wider range of conditions to choose from.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing laminated device chips, comprising:
    a preparing step of preparing a first device wafer having a plurality of areas demarcated in a face side thereof by a grid of first projected dicing lines established therein and containing respective first devices, a second device wafer having a plurality of areas demarcated in a face side thereof by a grid of second projected dicing lines established therein and containing respective second devices, and a support substrate;
    an integrating step of affixing the support substrate to the face side of the first device wafer to integrally combine the support substrate and the first device wafer with each other;
    after the integrating step, a thinning step of processing the first device wafer from a reverse side thereof to thin down the first device wafer to a predetermined thickness;
    a cutting step of forming cut grooves in the first device wafer along the first projected dicing lines thereby to cut the first device wafer;
    an affixing step of affixing the first device wafer as cut to the second device wafer;
    a peeling step of peeling the support substrate from the first device wafer as cut; and
    a dividing step of dividing the second device wafer along the second projected dicing lines into a plurality of individual laminated device chips.

2. The method of manufacturing laminated device chips according to claim 1, wherein:
    the integrating step includes affixing the support substrate to the first device wafer with an adhesive, and
    the peeling step includes reducing bonding strength of the adhesive and peeling off the support substrate from the first device wafer.

3. The method of manufacturing laminated device chips according to claim 1, wherein:
    the integrating step includes affixing the support substrate to the first device wafer with an adhesive, the cutting step includes fully cutting the support substrate together with the first device wafer into a plurality of device chips, the affixing step includes placing the device chips on the second device wafer from the first device wafer side and thereafter affixing a tape to the support substrate, and the peeling step includes applying a laser beam through the tape and the support substrate to the adhesive to reduce bonding strength of the adhesive and peeling off the support substrate together with the tape from the first device wafer.

4. The method of manufacturing laminated device chips according to claim 3, further comprising:

after the peeling step and before the dividing step, encapsulating areas that do not overlap the first device wafer and that overlap the second device wafer with an encapsulating resin.

5. The method of manufacturing laminated device chips according to claim 1, wherein:

the integrating step includes affixing the support substrate to the first device wafer with a thermoplastic adhesive, the cutting step includes fully cutting the support substrate together with the first device wafer into a plurality of device chips, the affixing step includes placing the device chips on the second device wafer from the first device wafer side and thereafter affixing a retrieval substrate to the support substrate with a thermosetting adhesive, and the peeling step includes heating the thermoplastic adhesive to reduce bonding strength of the thermoplastic adhesive and peeling off the support substrate together with the retrieval substrate from the first device wafer.

6. The method of manufacturing laminated device chips according to claim 4, further comprising:

after the peeling step and before the dividing step, encapsulating areas that do not overlap the first device wafer and that overlap the second device wafer with an encapsulating resin.

7. The method of manufacturing laminated device chips according to claim 1, further comprising:

after the peeling step and before the dividing step, encapsulating areas that do not overlap the first device wafer and that overlap the second device wafer with an encapsulating resin.

* * * * *